(12) United States Patent
Santou (10) Patent No.: US 7,221,214 B2
(45) Date of Patent: May 22, 2007

(54) DELAY VALUE ADJUSTING METHOD AND SEMICONDUCTOR INTEGRATED CIRCUIT

(75) Inventor: Moriyuki Santou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/968,944

(22) Filed: Oct. 21, 2004

(65) Prior Publication Data
US 2005/0270078 A1    Dec. 8, 2005

(30) Foreign Application Priority Data
Jun. 8, 2004    (JP)    ............................. 2004-170052

(51) Int. Cl.
*H01L 25/00* (2006.01)
(52) U.S. Cl. .................... 327/565; 327/264; 327/278
(58) Field of Classification Search ........ 327/261–264, 327/268–272, 276–278, 285, 288, 437, 564–566
See application file for complete search history.

(56) References Cited

U.S. PATENT DOCUMENTS

| | | | | |
|---|---|---|---|---|
| 5,039,893 A | * | 8/1991 | Tomisawa | ............ 327/276 |
| 5,227,679 A | | 7/1993 | Woo | ............ 307/469 |
| 5,486,774 A | * | 1/1996 | Douseki et al. | ............ 326/33 |
| 6,117,735 A | * | 9/2000 | Ueno | ............ 438/268 |
| 6,172,545 B1 | * | 1/2001 | Ishii | ............ 327/276 |

FOREIGN PATENT DOCUMENTS

| | | |
|---|---|---|
| JP | 5-226619 | 9/1993 |
| JP | 5-226988 | 9/1993 |
| JP | 5-268015 | 10/1993 |

* cited by examiner

*Primary Examiner*—Timothy P. Callahan
*Assistant Examiner*—Hai L. Nguyen
(74) *Attorney, Agent, or Firm*—Staas & Halsey LLP (57) ABSTRACT

The method provides wide-range delay value adjustment without making changes in cell size and metal wiring, even when a process variation occurs. Threshold values of some or all of the transistors which form the delay gate inserted into the signal path are varied to control the delay value of the delay gate, so that the delay value of the signal path is adjusted.

24 Claims, 8 Drawing Sheets

DELAY VALUE ADJUSTING METHOD AND SEMICONDUCTOR INTEGRATED CIRCUIT

BACKGROUND OF THE INVENTION

1. Field of the Invention

The present invention relates to a method for adjusting a delay value of a signal path by inserting a delay gate, which is a standard cell of a semiconductor integrated circuit, into a signal path formed in the semiconductor integrated circuit. The invention also relates to the semiconductor integrated circuit, in which the delay value of the signal path is adjusted with the same method.

2. Description of the Related Art

Generally speaking, when change in a manufacturing process of a semiconductor integrated circuit causes transistor performance variation (hereinafter will be called the "process variation"), the delay value of each signal path is required to be adjusted to satisfy a predetermined value. Thus, when designing semiconductor integrated circuits, delay gates are commonly inserted into signal paths with small delay values, as a measurement against racing among latches.

The individual delay gates, which are standard cells of semiconductor integrated circuits, include two or more transistors in combination. More precisely, as shown in FIG. 8A through FIG. 8C, one or more inverters 10, each of which is a combination of a P-channel MOS (Metal Oxided Semiconductor) transistor 10$p$ and an N-channel MOS transistor 10$n$, are connected, thereby forming a delay gate (see, for example, the following patent application 1 through 3).

Figure 8A:
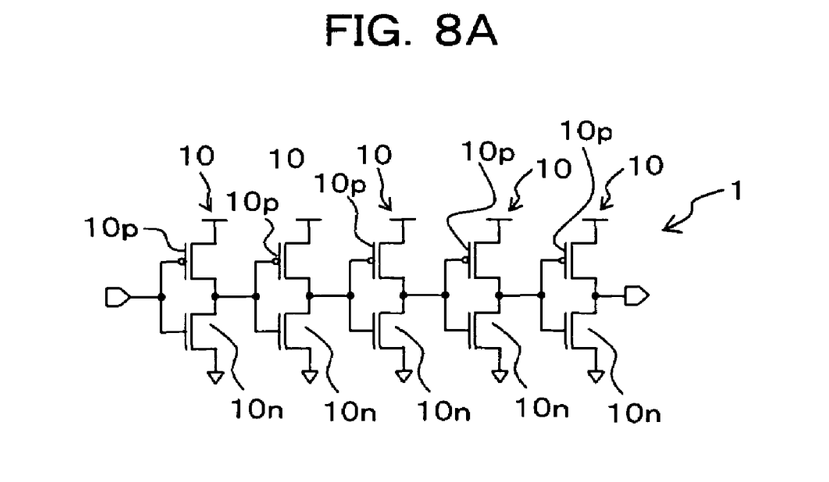
FIG. 8A through FIG. 8C are views each showing a common delay gate, which is also an example of a construction of a delay gate for use in the delay value adjusting method (semiconductor integrated circuit) of the first embodiment.
Figure 8B:
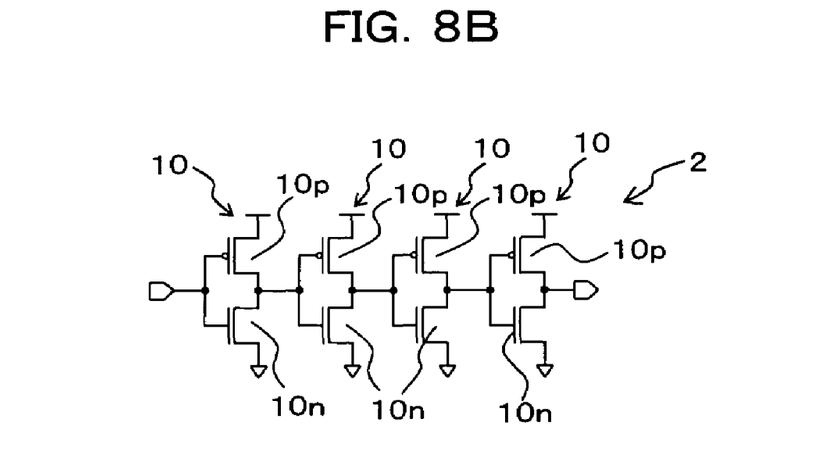
Figure 8C:
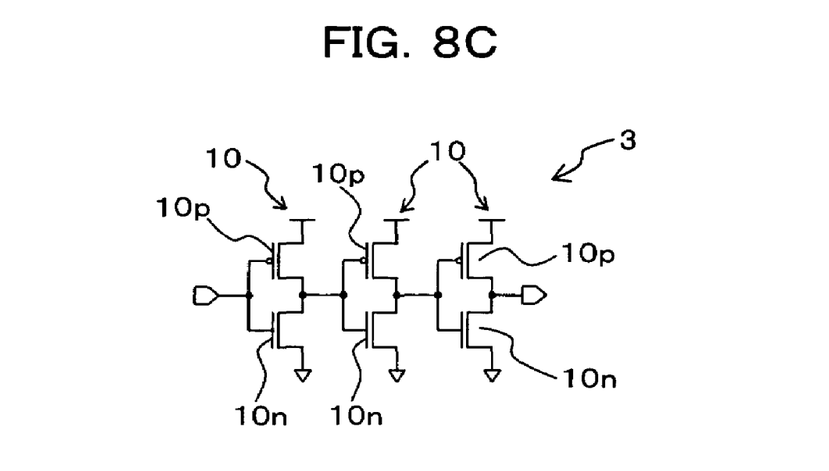

The delay gate 1 of FIG. 8A is formed by five inverters 10 connected; the delay gate 2 of FIG. 8B is formed by four inverters 10 connected; the delay gate 3 of FIG. 8C is formed by three inverters 10 connected. Since the delay gates 1 and 3 of FIG. 8A and FIG. 8C, respectively, are formed by an odd number of inverters 10, they function as inverters. On the other hand, since the delay gate 2 of FIG. 8B is formed by an even number of inverters 10, it functions as a buffer.

In such common delay value adjusting methods using delay gates, the number of inverters connected, which form delay gates, is varied, or the gate lengths L of the transistors forming the delay gates are varied. In the former method, the greater the number of inverters connected, the greater the delay value realized. In the latter method, the greater the gate length L, the greater the delay value realized.

As a common procedure, the gate widths W of the transistors are changed, before the number of inverters connected is increased or before the gate lengths L of the transistors are changed, so as to adjust the delay value (see, for example, the following patent application 1). Generally speaking, the smaller the gate width W, the greater the delay value, whereas the greater the gate width W, the smaller the delay value. Therefore, first of all, the gate width W is firstly changed to adjust the delay value, and then, if it is still impossible to control the delay value of the delay gate to a desired value (that is, if the delay value exceeds a delay value adjustable range in which the delay value can be adjusted by changing the gate widths W of the transistors), the number of inverters connected and the lengths L of the transistors are changed, to adjust the delay value.

[Patent application 1] Japanese Patent Application Publication No. HEI 5-226619

[Patent application 2] Japanese Patent Application Publication No. HEI 5-226988

[Patent application 1] Japanese Patent Application Publication No. HEI 5-268015

However, the method in which the number of inverters is changed to adjust the delay value faces the following problem. If the delay value exceeds the range that can be adjusted by gate width W variation, the number of inverters connected is changed, so that the area (cell size, that is, the size of the delay gate) and metal wiring require changing.

Further, the method in which the gate lengths L of transistors are changed to adjust the delay value faces the following problem. If the delay value exceeds the range that can be adjusted by gate width W variation, some packaging rules necessitate change in cell size and in metal wiring. Furthermore, since the gate lengths L of the transistors are influenced by manufacturing variations, all the transistors preferably have the same gate length L, and it is thus undesirable that the delay value adjustment is performed by changing the gate length L.

In both of the previous delay value adjusting methods, if the delay value exceeds the range that can be adjusted by gate width W variation, the cell size and metal wiring must be changed, so that cell rearrangement and rewiring in high-order design (for example, layout design of standard cells including delay gates) are necessitated.

SUMMARY OF THE INVENTION

With the foregoing problems in view, an object of the present invention is to provide delay adjustment which supports a wide range of delay values without making any change in cell size and in metal wiring as much as possible. This makes it possible to support the process variation without implementing any effects on high-order design such as layout design of standard cells.

In order to accomplish the above object, according to the present invention, there is provided a delay value adjusting method for adjusting a delay value of a signal path formed in a semiconductor integrated circuit, which method comprises: inserting a delay gate including a plurality of transistors in combination into the signal path; and changing threshold voltages of some or all of the plural transistors forming the delay gate inserted in the signal path, to control a delay value of the delay gate, so that the delay value of the signal path is adjusted.

As a generic feature, there is provided a delay value adjusting method for adjusting a delay value of a signal path formed in a semiconductor integrated circuit, which method comprises: previously preparing delay gate candidates, each of which is formed by the same number of transistors arranged in the same layout, some or all of the transistors being given different threshold voltages, to provide a plurality of kinds of delay gate candidates with different delay values; selecting, from the plural kinds of delay gate candidates, one delay gate candidate corresponding to the delay value of the signal path; and inserting the selected delay gate candidate as a delay gate into the signal path, to adjust the delay value of the signal path.

As a preferred feature, serial transistors are employed as the transistors forming the delay gate, to increase the number of transistors forming the delay gate, and the individual serial transistors are subjected to voltage threshold changing. As another preferred feature, the threshold voltage is changed by controlling an impurity in a channel unit of each of the transistors.

As another generic feature, there is provided a semiconductor integrated circuit in which the delay value of a signal path is adjusted by the foregoing delay value adjusting method.

According to the delay value adjusting method and the semiconductor integrated circuit of the present embodiments, the delay value of a signal path is adjusted, by varying threshold voltages of some or all of the transistors which form a delay gate, or by selecting a delay gate from two or more types of delay gates previously prepared, and inserting the selected delay gate into the signal path. This makes it possible to adjust a wide range of delay values without making any changes in cell size and in metal wiring even if a process variation occur, so that the process variation can be supported without making any effects on the high-order design such as standard cell layout design.

At this time, serial transistors are used to increase the number of transistors forming the delay gate, and each of the serial transistors is subjected to threshold variation. This provides more minute delay value adjustment, and delay values can be adjusted in a wider range.

Other objects and further features of the present invention will be apparent from the following detailed description when read in conjunction with the accompanying drawings.

DESCRIPTION OF THE PREFERRED EMBODIMENT(S)

Preferred embodiments of the present invention will now be described with reference to the relevant accompanying drawings.

[1] Principle of the Present Invention

Preferred embodiments (a first and a second embodiment, as described later) also insert a delay gate into a signal path formed in a semiconductor integrated circuit, so as to adjust a delay value of the signal path equal to the desired delay value. When any process variation occurs, the gate widths W of transistors forming the delay gate that is inserted in the signal path are changed, to control the delay value of the delay gate. If it is still impossible to control the delay value of the delay gate to a desired value by such changing of the delay gate width W (for example, in cases where the gate widths W reach their maximum or minimum size), the present embodiments change threshold voltages (Vth) of some or all of the transistors forming the delay gate (will be detailed later with reference to FIG. 1A through FIG. 6B and FIG. 8A through FIG. 8C), instead of changing the number of inverters connected or changing the gate lengths (L) of the transistors, to control the delay value of the delay gate, so as to adjust the delay value of the signal path.

At that time, two or more types of delay gates with different delay values are previously prepared. The delay gates are formed by the same number of transistors arranged in the same layout, but some or all of the transistors forming each delay gate are given different threshold values (Vth), to provide the different types of delay gates. From the different types of delay gates, a delay gate corresponding to the delay value of an object signal path is selected and inserted in the signal path, there by varying the threshold voltage (Vth), to adjust the delay value of the signal path.

Figure 6A:
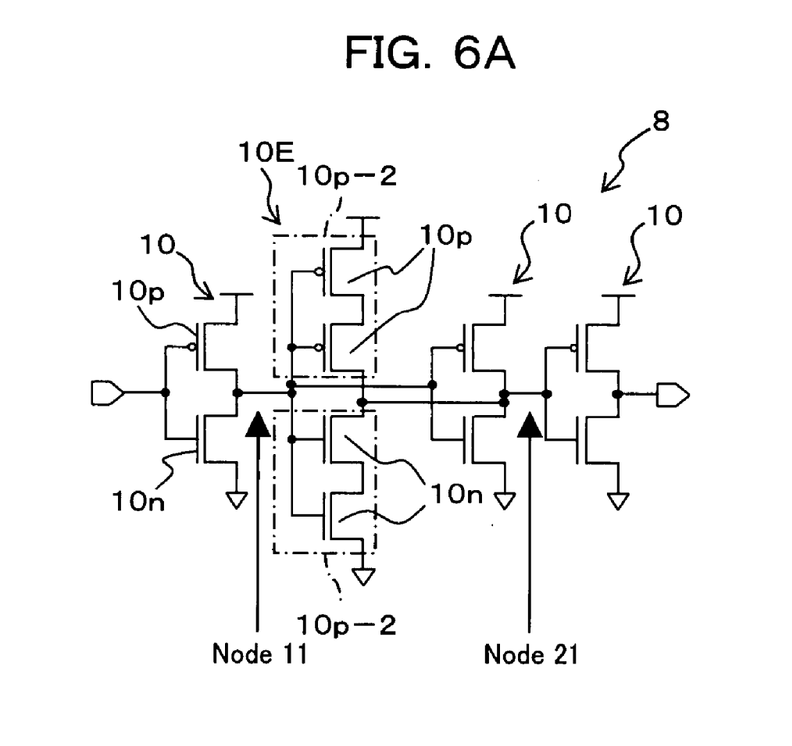
Figure 6B:
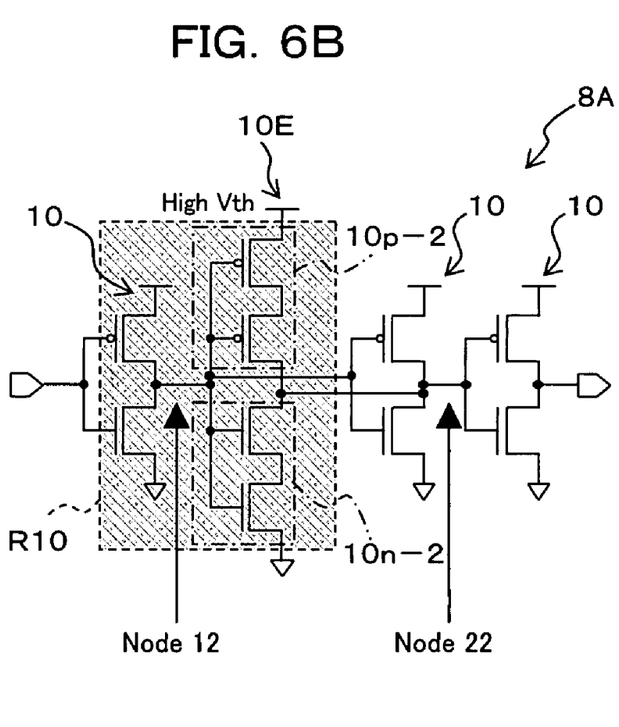
Figure 7:
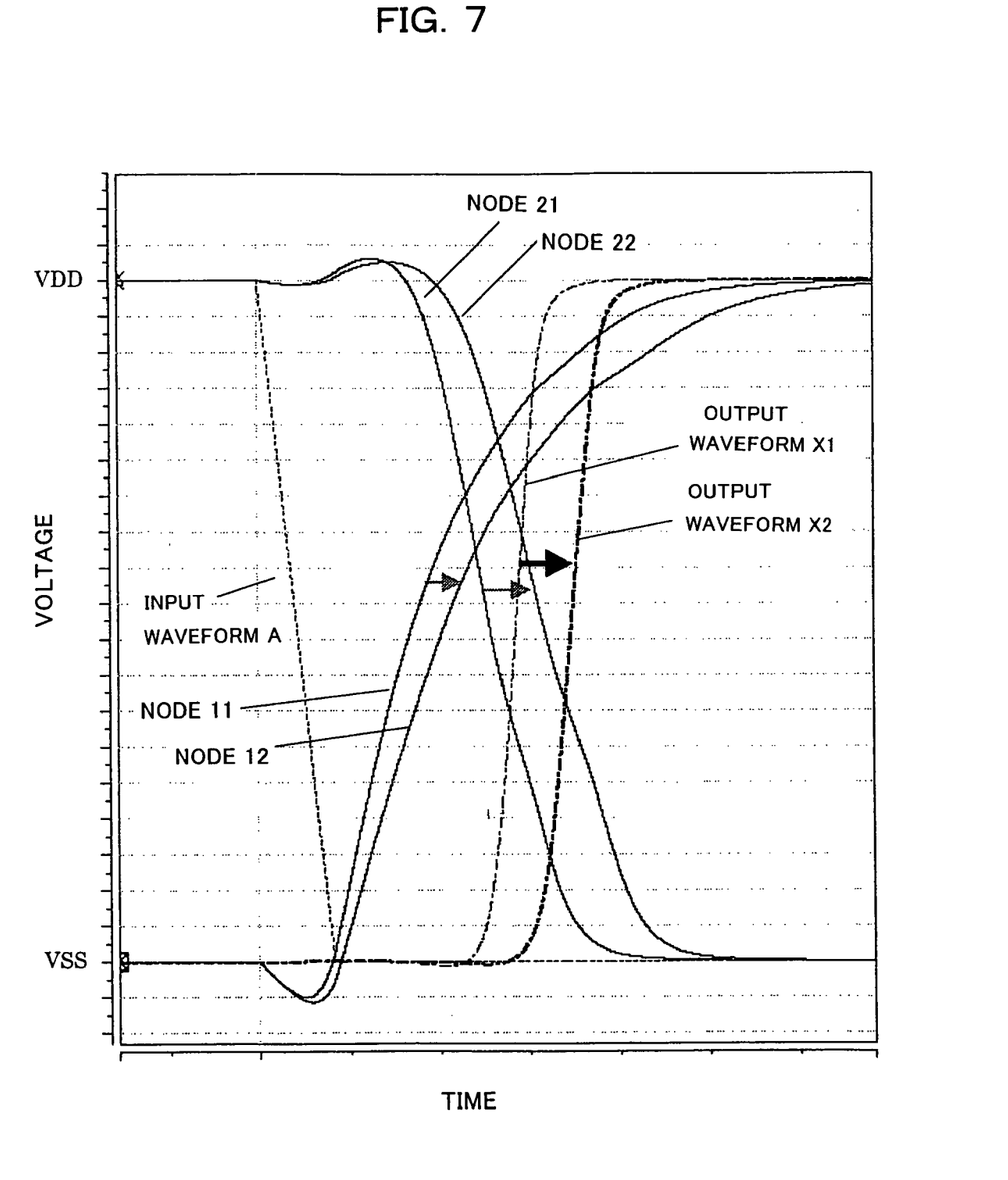
FIG. 7 is a graph indicating a result of simulation of signal delays (delays in an input waveform) caused by the delay gates of FIG. 6A and FIG. 6B.

Such a variation in threshold voltage will change the timings with which the transistors operate (will be detailed more in the second embodiment with reference to FIG. 6A, FIG. 6B, and FIG. 7. Thus, in comparison with transistors (hereinafter will be called "normal threshold voltage transistors") which operate at a normal threshold voltage (Normal Vth), transistors (hereinafter will be called "high threshold voltage transistors") which operate at higher threshold voltages (High Vth) than the normal threshold (Normal Vth) are slow in signal output, and transistors (hereinafter will be called "low threshold voltage transistors") which operate at lower threshold voltages (Low Vth) than the normal threshold voltages (Normal Vth) are early in signal output. For example, provided that the delay value of a signal path is to be increased (slowed down), some or all of the normal threshold voltage transistors should be replaced by high threshold voltage transistors.

Accordingly, in cases where two different threshold voltages (for example, a normal threshold voltage and a high threshold voltage) can be selected, there are $2 \cdot n$ possible combinations of transistors. In cases where three different threshold voltages (for example, a normal threshold voltage, a high threshold voltage, and a low threshold voltage) can be selected, there are $3 \cdot n$ possible combinations of transistors. Generally speaking, where m threshold values can be selected for n transistors, there are $m \cdot n$ possible combinations of transistors.

Here, the threshold voltage (Vth) of an individual transistor is a gate voltage which serves as a boundary value when the transistor is switched from an OFF state (with no drain current passing through) into an ON state (with a drain current passing through). The threshold voltage (Vth) can be varied by controlling impurities in a channel unit of the transistor. Further, as already described, the delay gate is one of the standard cells of a semiconductor integrated circuit, and the delay gate is formed by two or more transistors $10p$ and $10n$ (see FIG. 1A through FIG. 6B and FIG. 8A through FIG. 8C) in combination.

[2] First Embodiment

A description will be made hereinbelow of a delay value adjusting method (semiconductor integrated circuit) according to a first embodiment of the present invention, referring to FIG. 1A through FIG. 1D and FIG. 8A through FIG. 8C. FIG. 1A through FIG. 1D and FIG. 8A through FIG. 8C are circuit diagrams each showing an example of a construction of a delay gate for use in the first embodiment.

Here, delay gates 1, 2, and 3 of FIG. 8A, FIG. 8B, and FIG. 8C, respectively, include only normal threshold voltage transistors and do not include any threshold voltage-changed transistors. Further, the delay gate 1 of FIG. 8A has five inverters 10 connected, each including a P-channel MOS transistor $10p$ paring with an N-channel MOS transistor $10n$, and has an inverter function (signal inverting function). The delay gate 2 of FIG. 8B has four inverters 10 connected and has a buffer function; the delay gate 3 of FIG. 8C has three inverters 10 connected and has an inverter function.

In contrast to this, the delay gates 1A, 2A, 3A, and 3B of FIG. 1A, FIG. 1B, FIG. 1C, and FIG. 1D, respectively, include high threshold voltage transistors (threshold voltage-changed transistors).

Figure 1A:
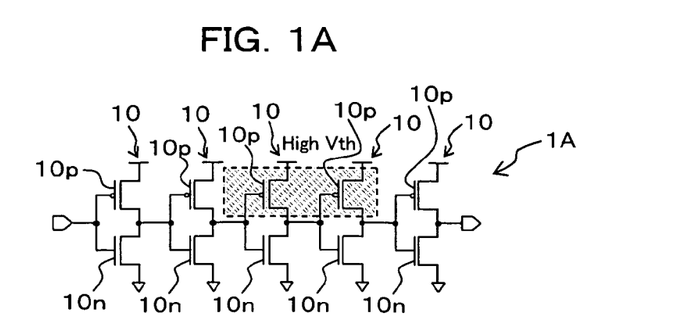
FIG. 1A through FIG. 1D are circuit diagrams each showing an example construction of a delay gate for use in a delay value adjusting method (semiconductor integrated circuit) of a first embodiment of the present invention.

The delay gate 1A of FIG. 1A and the delay gate 1 of FIG. 8A include the same number of transistors 10*p* and 10*n* arranged in the same layout, but two, enclosed by the broken line in FIG. 1A, of the P-channel MOS transistors 10*p* have a threshold voltage (High Vth) higher than the normal threshold voltage (Normal Vth), and the remaining transistors 10*p* and 10*n* operate at the normal threshold voltage (Normal Vth). Under a condition where the delay gate 1 of FIG. 8A is inserted in a signal path, the gate widths W of the transistors 10*p* and 10*n* of the delay gate 1 are changed. Then, if it is still impossible to control the delay value of the delay gate 1 to a desired value by such gate width changing, the delay gate 1 is replaced by the delay gate 1A of FIG. 1A, so that the delay value is adjusted to the desired value.

Figure 1B:
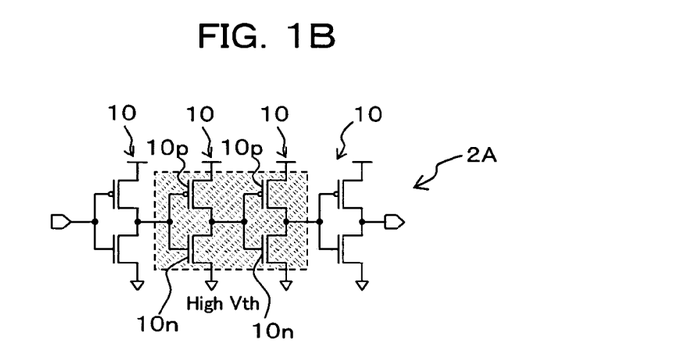

The delay gate 2A of FIG. 1B and the delay gate 2 of FIG. 8B include the same number of transistors 10*p* and 10*n* arranged in the same layout, but two, enclosed by the broken line in FIG. 1B, of the P-channel MOS transistors 10*p* and two, enclosed also by the broken line in FIG. 1B, of the N-channel MOS transistors 10*n* have a threshold voltage (High Vth) higher than the normal threshold voltage (Normal Vth), and the remaining transistors 10*p* and 10*n* operate at the normal threshold voltage (Normal Vth). Under a condition where the delay gate 2 of FIG. 8B is inserted in a signal path, the gate widths W of the transistors 10*p* and 10*n* of the delay gate 2 are changed. Then, if it is still impossible to control the delay value of the delay gate 2 to a desired value by such gate width changing, the delay gate 2 is replaced by the delay gate 2A of FIG. 1B, so that the delay value is adjusted to the desired value.

Figure 1C:
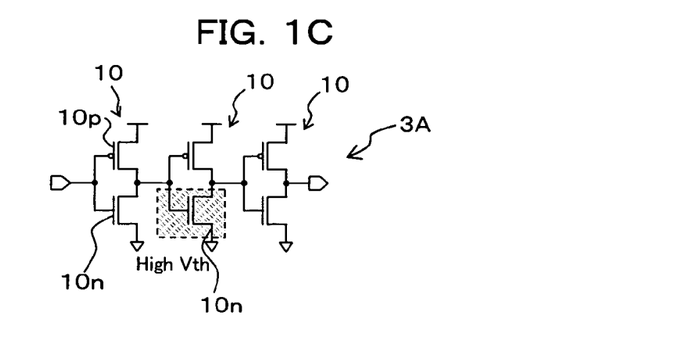

The delay gate 3A of FIG. 1C and the delay gate 3 of FIG. 8C include the same number of transistors 10*p* and 10*n* arranged in the same layout, but one, enclosed by the broken line in FIG. 1C, of the N-channel MOS transistors 10*n* has a threshold voltage (High Vth) higher than the normal threshold voltage (Normal Vth), and the remaining transistors 10*p* and 10*n* operate at the normal threshold voltage (Normal Vth).

Figure 1D:
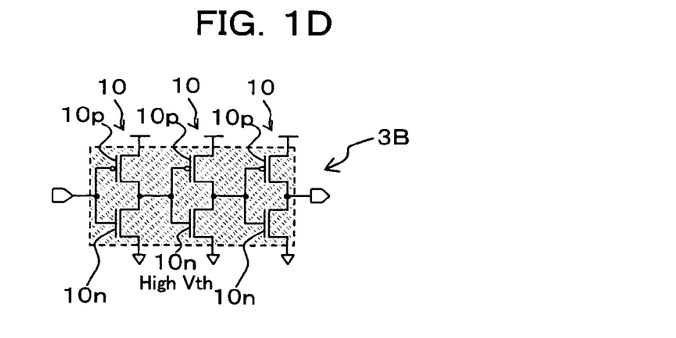

The delay gate 3B of FIG. 1D and the delay gate 3 of FIG. 8C include the same number of transistors 10*p* and 10*n* arranged in the same layout, and all of the transistors 10 have a threshold voltage (High Vth) higher than the normal threshold voltage (Normal Vth). Under a condition where the delay gate 1 of FIG. 8C is inserted in a signal path, the gate widths W of the transistors 10*p* and 10*n* of the delay gate 1 are changed. Then, if it is still impossible to control the delay value of the delay gate 1 to a desired value by such gate width changing, the delay gate 3 is replaced by the delay gate 3A of FIG. 1B or by the delay gate 3D of FIG. 1D, so that the delay value is adjusted to the desired value.

In this manner, if change in the gate width W of transistors 10*p* and 10*n* is incapable of controlling the delay value of the delay gate to a desired value, the threshold values of the transistors 10*p* and 10*n* are changed, or the delay gate is replaced by a delay gate some or all of whose transistors are changed in threshold voltage. This makes it possible to provide a delay value adjustment width larger than when only the gate width W is changed, without making any change in cell size and metal wiring. As a result, large delay widths will be supported, and it is possible to cope with process variation with reliability, without making any effects on the high-order design such as layout design of standard cells.

[3] Second Embodiment

Figure 2A:
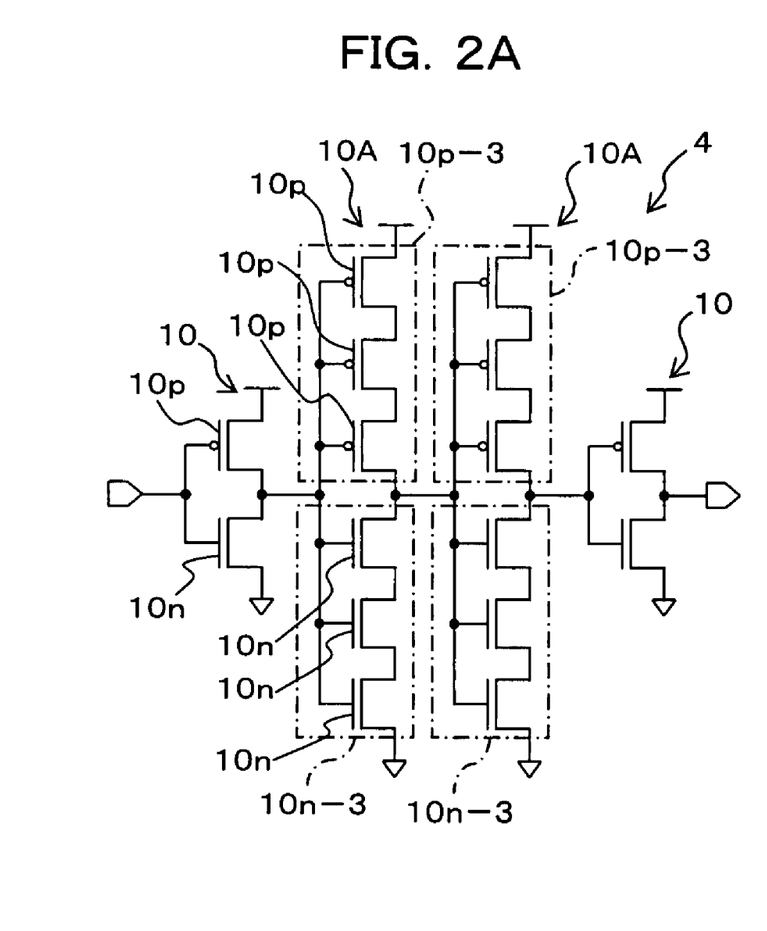
FIG. 2A, FIG. 2B, FIG. 3A, FIG. 3B, FIG. 4A, FIG. 4B, FIG. 5A, FIG. 5B, FIG. 6A, and FIG. 6B are circuit diagrams each showing an example construction of a delay gate for use in a delay value adjusting method (semiconductor integrated circuit) of a second embodiment of the present invention.
Figure 2B:
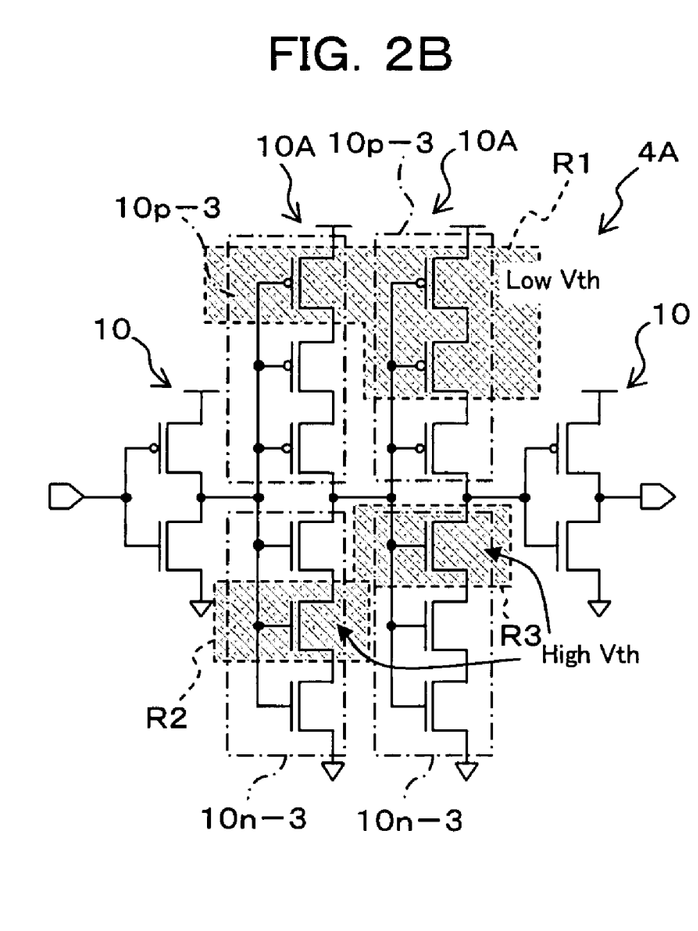
Figure 3A:
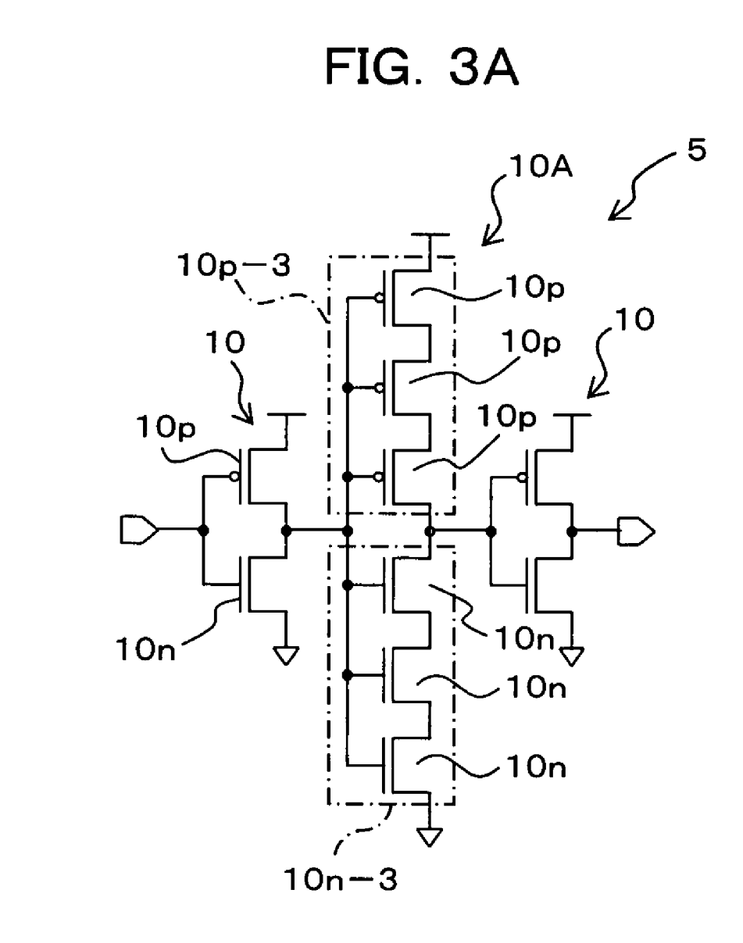
Figure 3B:
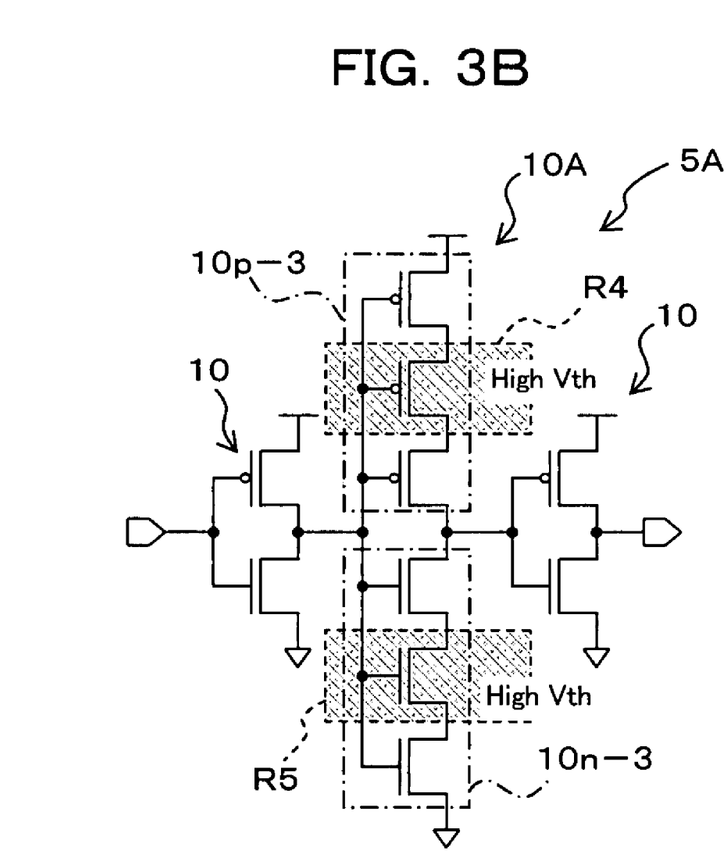
Figure 4A:
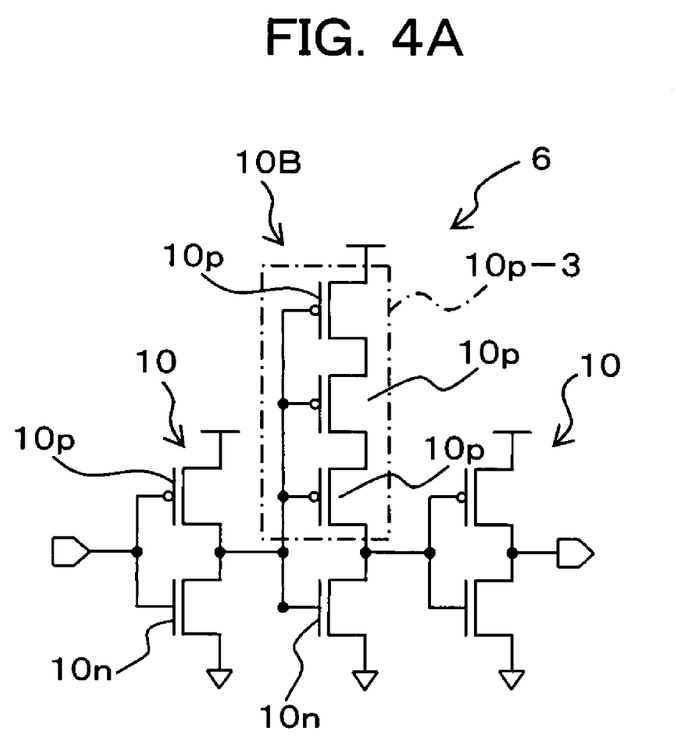
Figure 4B:
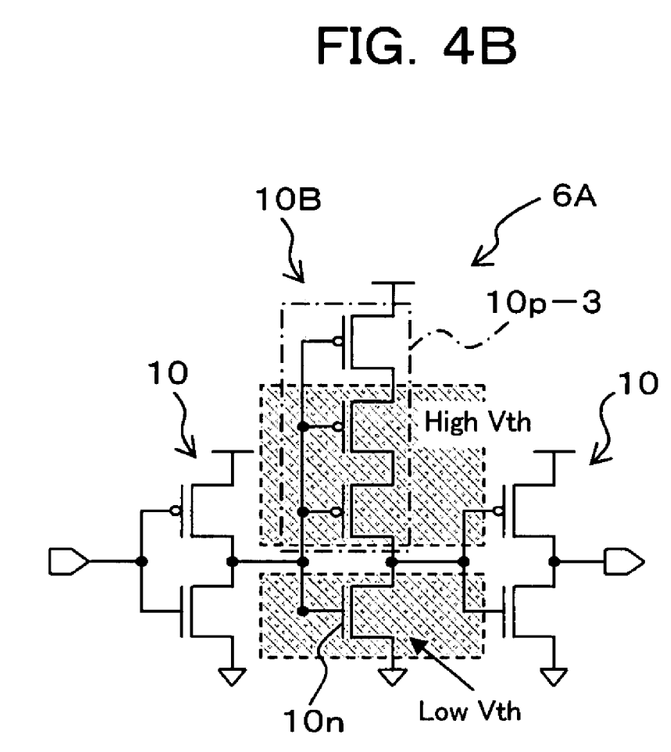
Figure 5A:
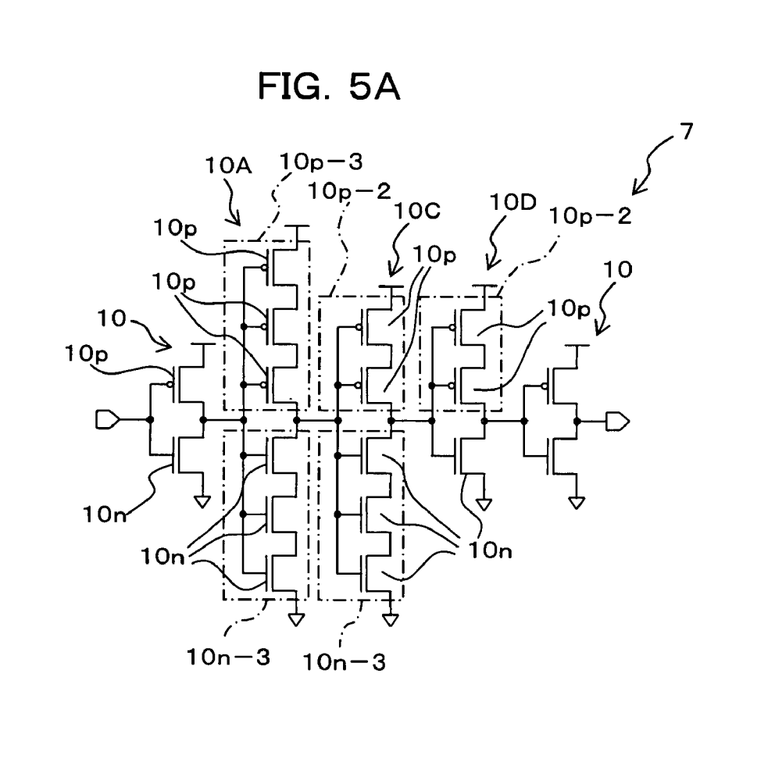
Figure 5B:
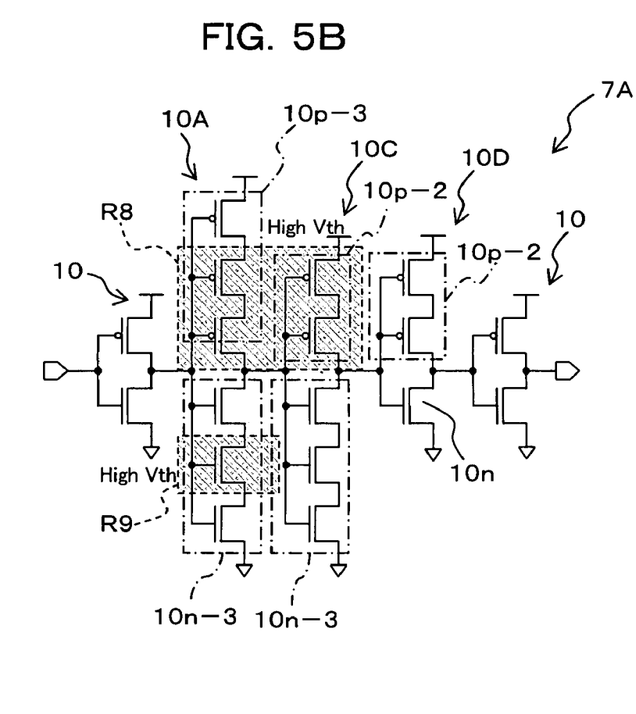

A description will be made hereinbelow of a delay adjusting method (semiconductor integrated circuit) of a second embodiment of the present invention, referring to FIG. 2A through FIG. 6B. FIG. 2A, FIG. 2B; FIG. 3A, FIG. 3B; FIG. 4A, FIG. 4B; FIG. 5A, FIG. 5B; and FIG. 6A, and FIG. 6B are circuit diagrams showing example constructions of delay gates for use in the delay value adjusting method (semiconductor integrated circuit) in the second embodiment.

Delay gates 4, 5, 6, 7, and 8 of FIG. 2A, FIG. 3A, FIG. 4A, FIG. 5A, and FIG. 6A, respectively, are formed by normal threshold voltage transistors, without using any threshold voltage-changed transistors, but include serial transistors (vertically arranged transistors), as will be described later.

The delay gate 4 of FIG. 2A is formed by four inverters 10, 10A, 10A, and 10 connected to carry out a buffer function. The two inverters 10A disposed in the middle include serial transistors. Each of the inverters 10A is a combination of a set of three serial transistor elements, a 3-divided P-channel MOS transistor 10*p*-3, and another set of three serial transistor elements, a 3-divided N-channel MOS transistor 10*n*-3. As shown in FIG. 2A, the 3-divided P-channel MOS transistor 10*p*-3 includes three transistor elements connected in series, and each of the transistor elements is designated by reference character 10*p*. Likewise, the 3-divided N-channel MOS transistor 10*n*-3 includes three transistor elements connected in series, and each of the transistor elements is designated by reference character 10*n*.

The delay gate 5 of FIG. 3A includes three inverters 10, 10A, and 10, to carry out an inverter function. The one inverter 10A disposed in the middle includes serial transistors, as already described above, and the inverter 10A is a combination of a 3-divided P-channel MOS transistor 10*p*-3 and a 3-divided N-channel MOS transistor 10*n*-3.

The delay gate 6 of FIG. 4A includes three inverters 10, 10B, and 10, to serve as an inverter. The one inverter 10B disposed in the middle includes serial transistors, as already described above, and the inverter 10B is a combination of a 3-divided P-channel MOS transistor 10*p*-3 and an N-channel MOS transistor 10*n*.

The delay gate 7 of FIG. 5A includes five inverters 10, 10A, 10C, 10D, and 10, to serve as an inverter. The three inverters 10A, 10C, and 10D, disposed in the middle include serial transistors. The inverter 10A is a combination of a 3-divided P-channel MOS transistor 10*p*-3 and a 3-divided N-channel MOS transistor 10*n*-3; the inverter 10C is a 2-divided P-channel MOS transistor 10*p*-2 and a 3-divided N-channel MOS transistor 10*n*-3; the inverter 10D is a combination of a 2-divided P-channel MOS transistor 10*p*-2 and an N-channel MOS transistor 10*n*. Here, as shown in FIG. 5A, the 2-divided P-channel MOS transistor 10*p*-2 is a set of two transistor elements 10*p* connected in series, and both of the two transistor elements are designated by reference character 10*p*.

The delay gate 8 of FIG. 6A includes four inverters 10, 10E, 10, and 10, to serve as a buffer. The inverter 10E includes serial transistors, and is a combination of a 2-divided P-channel MOS transistor 10*p*-2 and a 2-divided N-channel MOS transistor 10*n*-2. As shown in FIG. 6A, the 2-divided N-channel MOS transistor 10*n*-2 includes two transistor elements 10*n* connected in series, and each of the transistor elements are designated by reference character 10*n* in FIG. 6A.

In contrast to this, the delay gates 4A, 5A, 6A, 7A, and 8A of FIG. 2B, FIG. 3B, FIG. 4B, FIG. 5B, and FIG. 6B, respectively, include threshold voltage-changed transistors (high threshold voltage transistors/low threshold voltage transistors).

The delay gate 4A of FIG. 2B and the delay gate 4 of FIG. 2A include the same number of transistors 10$p$ and 10$n$ arranged in the same layout, but the three P-channel MOS transistors 10$p$ in region R1 enclosed by the broken line in FIG. 2B have a threshold voltage (Low Vth) lower than the normal threshold voltage (Normal Vth), and the two N-channel MOS transistors 10$n$ in regions R2 and R3 enclosed by the broken lines in FIG. 2B have a threshold voltage (High Vth) higher than the normal threshold voltage (Normal Vth). The remaining transistors 10$p$ and 10$n$ operate at the normal threshold voltage (Normal Vth). Under conditions where the delay gate 4 of FIG. 2A is inserted in a signal path, the gate widths W of the transistors 10$p$ and 10$n$ of the delay gate 4 are changed. Then, if it is still impossible to control the delay value of the delay gate 4 to a desired value by such gate width changing, the delay gate 4 is replaced by the delay gate 4A of FIG. 2B, so that the delay value is adjusted to the desired value.

The delay gate 5A of FIG. 3B and the delay gate 5 of FIG. 3A include the same number of transistors 10$p$ and 10$n$ arranged in the same layout, but the two P-channel MOS transistors 10$p$ in regions R4 and R5 enclosed by the broken line in FIG. 5A have a threshold voltage (High Vth) higher than the normal threshold voltage (Normal Vth), and the remaining transistors 10$p$ and 10$n$ operate at the normal threshold voltage (Normal Vth). Under conditions where the delay gate 5 of FIG. 3A is inserted in a signal path, the gate widths W of the transistors 10$p$ and 10$n$ of the delay gate 5 are changed. Then, if it is still impossible to control the delay value of the delay gate 5 to a desired value by such gate width changing, the delay gate 5 is replaced by the delay gate 5A of FIG. 3B, so that the delay value is adjusted to the desired value.

The delay gate 6A of FIG. 4B and the delay gate 6 of FIG. 4A include the same number of transistors 10$p$ and 10$n$ arranged in the same layout, but the two P-channel MOS transistors 10$p$ in region R6 enclosed by the broken line in FIG. 4B have a threshold voltage (High Vth) higher than the normal threshold voltage (Normal Vth), and the one N-channel MOS transistor 10$n$ in region R7 enclosed by the broken lines in FIG. 4B have a threshold voltage (Low Vth) lower than the normal threshold voltage (Normal Vth). The remaining transistors 10$p$ and 10$n$ operate at the normal threshold voltage (Normal Vth). Under a condition where the delay gate 6 of FIG. 4A is inserted in a signal path, the gate widths W of the transistors 10$p$ and 10$n$ of the delay gate 6 are changed. Then, if it is still impossible to control the delay value of the delay gate 6 to a desired value by such gate width changing, the delay gate 6 is replaced by the delay gate 6A of FIG. 4B, so that the delay value is adjusted to the desired value.

The delay gate 7A of FIG. 5B and the delay gate 7 of FIG. 5A include the same number of transistors 10$p$ and 10$n$ arranged in the same layout, but the four P-channel MOS transistors 10$p$ in region R8 enclosed by the broken line in FIG. 5B have a threshold voltage (High Vth) higher than the normal threshold voltage (Normal Vth), and the one N-channel MOS transistor 10$n$ in region R9 enclosed by the broken lines in FIG. 5B have a threshold voltage (High Vth) higher than the normal threshold voltage (Normal Vth). The remaining transistors 10$p$ and 10$n$ operate at the normal threshold voltage (Normal Vth). Under a condition where the delay gate 7 of FIG. 5A is inserted in a signal path, the gate widths W of the transistors 10$p$ and 10$n$ of the delay gate 7 are changed. Then, if it is still impossible to control the delay value of the delay gate 7 to a desired value by such gate width changing, the delay gate 7 is replaced by the delay gate 7A of FIG. 5B, so that the delay value is adjusted to the desired value.

The delay gate 8A of FIG. 6B and the delay gate 8 of FIG. 6A include the same number of transistors 10$p$ and 10$n$ arranged in the same layout, but the three P-channel MOS transistors 10$p$ and the three N-channel MOS transistors 10$n$ in region R10 enclosed by the broken line in FIG. 6B have a threshold voltage (High Vth) higher than the normal threshold voltage (Normal Vth), and the remaining transistors 10$p$ and 10$n$ operate at the normal threshold voltage (Normal Vth). Under a condition where the delay gate 8 of FIG. 6A is inserted in a signal path, the gate widths W of the transistors 10$p$ and 10$n$ of the delay gate 8 are changed. Then, if it is still impossible to control the delay value of the delay gate 8 to a desired value by such gate width changing, the delay gate 8 is replaced by the delay gate 8A of FIG. 6B, so that the delay value is adjusted to the desired value.

In this manner, the second embodiment of the present invention implements like effects and benefits to those of the first embodiment. Further, partly since serial transistors 10$p$-2, 10$n$-2, 10$p$-3, and 10$n$-3 are used as transistors which form the delay gates 4 through 8 and 4A through 8A, thereby increasing the number of transistors 10$p$ and 10$n$ which form the delay gate 4 through 8 and 4A through 8A, and partly since each of the transistors 10$p$ and 10$n$ can be subjected to threshold voltage changing, thereby increasing the combinations of threshold voltages, it is possible to minutely adjust a wide range of delay values.

Here, FIG. 7 indicates a simulation result of signal delay (delay in input waveform) caused by the delay gate 8 and 8A of FIG. 6A and FIG. 6B, respectively. FIG. 7 illustrates two output waveforms. One is a waveform which is obtained at Node 11, Node 21 and the output end (X1), when input waveform A is input to the delay gate 8, which includes only normal threshold voltage transistors as shown in FIG. 6A. The other is a wave form which is obtained at Node 12, Node, 22, and the output end (X2), when input waveform A is input to the delay gate 8A, in which some of the transistors are high threshold voltage transistors as shown in FIG. 6B. As is clear in this simulation result of FIG. 7, when an identical waveform A is input to the delay gates 8 and 8A, both of the internal waveform (Node 12 and Node 22) of the delay gate 8A and the output waveform X2, as shown by the arrow in FIG. 7, are delayed more than the internal waveform (Node 11 and Node 21) and the output waveform X1 of the delay gate 8.

[4] Other Modifications

The present invention should by no means be limited to the above-illustrated embodiment, but various changes or modifications may be suggested without departing from the gist of the invention.

For example, the above descriptions are made of the cases where the delay gates 1 through 8, 1A through 8A, and 3B of FIG. 1A through FIG. 6B and FIG. 8A through FIG. 8C are employed for delay value adjustment (in the semiconductor integrated circuit). However, other various types of delay gates, varying in their layout and the number of transistors contained, are also applicable, and like effects and benefits to those of the above embodiments are also provided.

Further, the threshold voltages of the first embodiment are two types of voltages, a normal threshold voltage and a high threshold voltage. The threshold voltages of the second embodiment are three types of voltages, a normal threshold voltage, a high threshold voltage, and a low threshold voltage. However, four or more types of threshold voltage can also be combined, thereby realizing finer delay value adjustment.

What is claimed is:

1. A semiconductor integrated circuit with a signal path formed therein, said semiconductor integrated circuit comprising:
   a delay gate, inserted into the signal path, having a plurality of transistors in combination,
   threshold voltages of some or all of the plurality of transistors inserted into the signal path having been changed in a layout of the semiconductor integrated circuit prior to manufacturing, or having been changed before completion of manufacturing of the semiconductor integrated circuit, without changing cell size of the delay gate and without rewiring the layout or rewiring during the manufacturing to make the change, to thereby control a delay value of said delay gate in the manufactured semiconductor integrated circuit so that a delay value of the signal path is set equal to a desired delay value.

2. A semiconductor integrated circuit as set forth in claim 1, wherein the threshold voltage is changed by controlling an impurity in a channel unit of each of the transistors.

3. A semiconductor integrated circuit as set forth in claim 1, wherein serial transistors are employed as the transistors forming said delay gate, to increase the number of transistors forming said delay gate, and the individual serial transistors are subjected to the voltage threshold changing.

4. A semiconductor integrated circuit as set forth in claim 3, wherein the threshold voltage is changed by controlling an impurity in a channel unit of each of the transistors.

5. A delay value adjusting method for adjusting a delay value of a signal path to be formed in a semiconductor integrated circuit, said method comprising:
   inserting a delay gate including a plurality of transistors in combination into the signal path to thereby provide a layout of the semiconductor integrated circuit, prior to manufacturing the semiconductor integrated circuit, with the inserted delay gate being a cell in the layout and having a cell size; and
   changing, before completion of manufacturing of the semiconductor integrated circuit, threshold voltages of some or all of the plural transistors forming the delay gate inserted in the signal path, to control a delay value of the delay gate, so that the delay value of the signal path is set equal to a desired delay value without changing the cell size of the cell or rewiring the layout.

6. A delay value adjusting method as set forth in claim 5, wherein the threshold voltage is changed by controlling an impurity in a channel unit of each of the transistors.

7. A delay value adjusting method as set forth in claim 5, wherein serial transistors are employed as the transistors forming the delay gate, to increase the number of transistors forming the delay gate, and the individual serial transistors are subjected to the voltage threshold changing.

8. A delay value adjusting method as set forth in claim 7, wherein the threshold voltage is changed by controlling an impurity in a channel unit of each of the transistors.

9. A delay value adjusting method as set forth in claim 5, wherein, if it is impossible to adjust the delay value of the delay gate to a desired value by controlling gate widths of the individual transistors, the delay value of the delay gate is controlled by changing threshold voltages of some or all of the plural transistors forming the delay gate inserted into the signal path.

10. A delay value adjusting method as set forth in claim 9, wherein the threshold voltage is changed by controlling an impurity in a channel unit of each of the transistors.

11. A delay value adjusting method as set forth in claim 9, wherein serial transistors are employed as the transistors forming the delay gate, to increase the number of transistors forming the delay gate, and the individual serial transistors are subjected to the voltage threshold changing.

12. A delay value adjusting method as set forth in claim 11, wherein the threshold voltage is changed by controlling an impurity in a channel unit of each of the transistors.

13. A delay value adjusting method for adjusting a delay value of a signal path formed in a semiconductor integrated circuit, said method comprising:
   previously preparing delay gate candidates, each of which is formed by the same number of transistors arranged in the same layout, some or all of said transistors being given different threshold voltages, to provide a plurality of kinds of delay gate candidates with different delay values;
   selecting, from the plural kinds of delay gate candidates, one delay gate candidate corresponding to the delay value of the signal path; and
   inserting the selected delay gate candidate as a delay gate into the signal path, to set the delay value of the signal path equal to a desired delay value.

14. A delay value adjusting method as set forth in claim 13, wherein the threshold voltage is changed by controlling an impurity in a channel unit of each of the transistors.

15. A delay value adjusting method as set forth in claim 13, wherein serial transistors are employed as the transistors forming the delay gate, to increase the number of transistors forming the delay gate, and the individual serial transistors are subjected to the voltage threshold changing.

16. A delay value adjusting method as set forth in claim 15, wherein the threshold voltage is changed by controlling an impurity in a channel unit of each of the transistors.

17. A delay value adjusting method as set forth in claim 13, wherein, if it is impossible to adjust the delay value of the delay gate to a desired value by controlling gate widths of the individual transistors, one delay gate candidate corresponding to the delay value of the signal path is selected from the plural kinds of delay gate candidates and inserted into the signal path.

18. A delay value adjusting method as set forth in claim 17, wherein the threshold voltage is changed by controlling an impurity in a channel unit of each of the transistors.

19. A delay value adjusting method as set forth in claim 17, wherein serial transistors are employed as the transistors forming the delay gate, to increase the number of transistors forming the delay gate, and the individual serial transistors are subjected to the voltage threshold changing.

20. A delay value adjusting method as set forth in claim 19, wherein the threshold voltage is changed by controlling an impurity in a channel unit of each of the transistors.

21. A semiconductor integrated circuit with a signal path formed therein, said semiconductor integrated circuit comprising:
   a delay gate, inserted into the signal path, including a plurality of transistors in combination,
   said delay gate being selected, from a plurality of kinds of delay gate candidates which are formed by the same number of transistors arranged in the same layout but have different delay values due to different threshold values of some or all of the transistors forming each of the delay gate candidates, according to a delay value of the signal path, so that the delay value of the signal path is set equal to a desired delay value.

22. A semiconductor integrated circuit as set forth in claim 21, wherein the threshold voltage is changed by controlling an impurity in a channel unit of each of the transistors.

23. A semiconductor integrated circuit as set forth in claim 21, wherein serial transistors are employed as the transistors forming said delay gate, to increase the number of transistors forming said delay gate, and the individual serial transistors are subjected to the voltage threshold changing.

24. A semiconductor integrated circuit as set forth in claim 23, wherein the threshold voltage is changed by controlling an impurity in a channel unit of each of the transistors.

* * * * *